(12) United States Patent
Mirabella et al.

(10) Patent No.: US 9,356,587 B2
(45) Date of Patent: May 31, 2016

(54) HIGH VOLTAGE COMPARISON CIRCUIT

(71) Applicant: STMicroelectronics S.r.l., Agrate Brianza (IT)

(72) Inventors: Ignazio Bruno Mirabella, Scicli (IT); Francesco Pulvirenti, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/622,322

(22) Filed: Feb. 13, 2015

(65) Prior Publication Data

US 2015/0236683 A1  Aug. 20, 2015

(30) Foreign Application Priority Data

Feb. 19, 2014  (IT) .............................. MI2014A0240

(51) Int. Cl.
*H03K 5/22* (2006.01)
*H03K 5/153* (2006.01)
*H03K 5/125* (2006.01)

(52) U.S. Cl.
CPC ..................................... *H03K 5/125* (2013.01)

(58) Field of Classification Search
CPC ....... H03K 5/2481; H03K 5/249; H03K 5/08; H03K 5/24; G01R 19/16519

USPC .................. 327/623, 65, 72, 77, 205–206, 63
See application file for complete search history.

(56) References Cited

U.S. PATENT DOCUMENTS

| 4,232,271 | A |  | 11/1980 | Dobkin et al. |  |
|---|---|---|---|---|---|
| 4,521,739 | A |  | 6/1985 | Peterson |  |
| 5,276,405 | A |  | 1/1994 | Mazzucco et al. |  |
| 5,463,339 | A | * | 10/1995 | Riggio, Jr. | 327/206 |
| 5,739,705 | A | * | 4/1998 | John | 327/74 |
| 6,133,764 | A | * | 10/2000 | Griffith et al. | 327/65 |
| 7,212,042 | B1 | * | 5/2007 | Pinai | 327/63 |
| 7,884,646 | B1 |  | 2/2011 | Bourstein |  |
| 8,890,599 | B1 | * | 11/2014 | Xiao et al. | 327/321 |
| 2003/0020516 | A1 | * | 1/2003 | Fujita | 327/63 |

OTHER PUBLICATIONS

IT Search Report and Written Opinion for IT MI2014A000240 dated Nov. 27, 2014 (7 pages).

* cited by examiner

*Primary Examiner* — Quan Tra
(74) *Attorney, Agent, or Firm* — Gardere Wynne Sewell LLP

(57) ABSTRACT

A high voltage comparison circuit includes an input stage generating an intermediate signal as a result of a comparison between an input signal and a first voltage reference and an output stage configured to generate an output signal referenced to a second voltage reference (different from the first voltage reference) in response to the intermediate signal.

17 Claims, 5 Drawing Sheets

HIGH VOLTAGE COMPARISON CIRCUIT

PRIORITY CLAIM

This application claims priority from Italian Application for Patent No. MI2014A000240 filed Feb. 19, 2014, the disclosure of which is incorporated by reference.

TECHNICAL FIELD

The present disclosure relates to a high voltage comparison circuit.

BACKGROUND

Several integrated circuits are required to be driven by different voltage references in order to immunize the circuits from the noise due to fluctuations of the power voltage references (due to the switching of the downstream power transistors) or for particular application in which devices have a floating voltage reference (e.g. ICL telemetry).

For example, U.S. Pat. No. 5,276,405 (incorporated by reference) discloses an integrated amplifier which includes an input stage with two BJT transistors Q1, Q2 each biased by a constant current IP3, IP4 while the collectors of the transistors Q1, Q2 are kept at fixed voltage references. A differential input signal IN(+)-IN(−) applied between the emitters of the transistors Q1, Q2 is transferred to the terminals of a first resistor R1 which is supplied with a bias current IR1 from a circuit formed by transistors Q5, Q6, Q7 which mirrors the bias current to a second resistor R6, from the terminals of which the output signal VOUT is taken. While the input signal IN(+)-IN(−) is differential, the output signal VOUT will be referred to a ground reference G.

The primary object of the invention disclosed in the above mentioned patent is to avoid the use of a second supply so that the amplifier can be supplied with a single supply voltage, while retaining the characteristics of high input impedance and dynamic range with equally high CMRR and PSRR values. However, the integrated amplifier could be also adopted to perform a conversion between voltage signals referred to different voltage references, in this case, from a differential input signal to a ground referred output signal.

Unfortunately, said known integrated circuit, where the input signal is provided by the emitters of the two transistors included in the input stage, are affected by the problem of an excessive current consumption at the input terminals. Moreover, a limited input voltage range is permitted before the breakage of the transistors of the input stages.

SUMMARY

One aspect of the present disclosure is to provide a high voltage comparison circuit a which solves the above mentioned problems.

In an embodiment, a high voltage comparison circuit comprises: an input stage arranged between a supply voltage and a first voltage reference, said input stage being configured to receive an input voltage signal and comprising at least a voltage comparator configured to provide an intermediate signal at the output terminal of the input stage as a result of a comparison between the input voltage signal and said first voltage reference; and an output stage arranged between said supply voltage and a second voltage reference, said second voltage reference being different from said first voltage reference, said output stage being configured to receive said intermediate signal and to provide an output voltage signal which is in response to said intermediate signal, wherein said input stage comprises at least a voltage buffer by means of which the input voltage signal is received from the input stage.

BRIEF DESCRIPTION OF THE DRAWINGS

For a better understanding of the present disclosure, a preferred embodiment thereof is now described, purely by way of non-limiting example and with reference to the annexed drawings, wherein.

DETAILED DESCRIPTION

Figure 1:
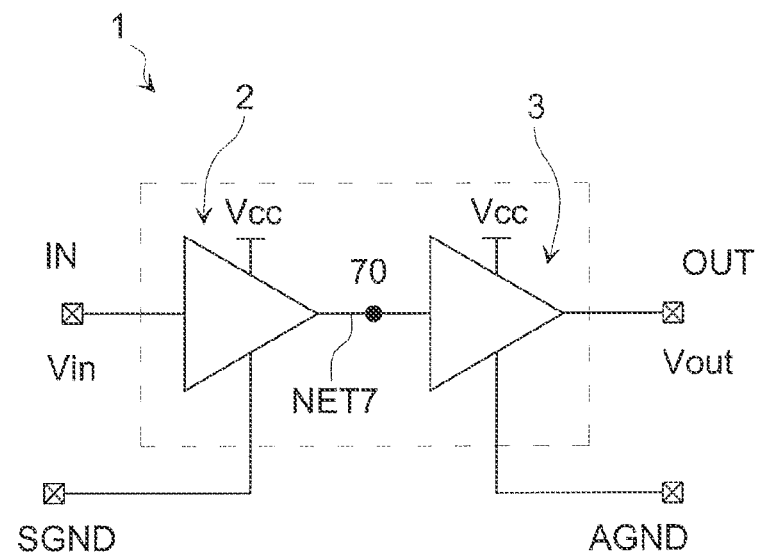
FIG. 1 is a block diagram of a high voltage comparison circuit according to the present disclosure.

A block diagram of a high voltage comparison circuit 1 according to the present disclosure is shown in FIG. 1. As can be seen, the high voltage comparison circuit 1 comprises an input stage 2 and an output stage 3.

The input stage 2 is arranged between a supply voltage Vcc and a first voltage reference SGND. The input stage 2 is configured to receive an input voltage signal Vin through an input terminal IN, and comprises at least a voltage comparator 5 (not shown in FIG. 1, see FIG. 2 for example) configured to provide an intermediate signal NET7 at an intermediate output terminal 70, at the output of the input stage 2, as a result of a comparison between the input voltage signal Vin and the first voltage reference SGND.

The output stage 3 is arranged between said supply voltage Vcc and a second voltage reference AGND, said second voltage reference AGND being different from the first voltage reference SGND. The output stage 3 is configured to receive the intermediate signal NET7 from the input stage 2 and to provide an output voltage signal Vout through an output terminal OUT. The output stage 3 performs a translation of the two logic levels of the intermediate signal NET7 and provides the output voltage signal Vout in response to the intermediate signal NET7.

The voltage comparator 5 (FIG. 2) has a first 30 and a second 40 input terminals coupled with said input voltage signal Vin and said first voltage reference SGND respectively, and an output terminal coinciding with the intermediate output terminal 70 at which said intermediate signal NET7 is provided.

The voltage comparator 5 is configured to perform the comparison between said input voltage signal Vin and said first voltage reference SGND and comprises a first N1 and a second N2 n-type MOSFET transistors having their gate terminals connected together to a common-gate node 10; the second transistor N2 is configured as a diode.

First and second resistors R1 are respectively connected in series with the source terminals of the first and second transistors N1, N2; in particular, the resistors R1 are connected between each source terminal of the transistor N1, N2 and the input terminals 30, 40.

The drain terminals of the first N1 and the second N2 transistors are supplied by a first G1 and a second G2 bias current generators, respectively. Thus a bias current I flows through both the first N1 and the second N2 transistors.

Figure 3:
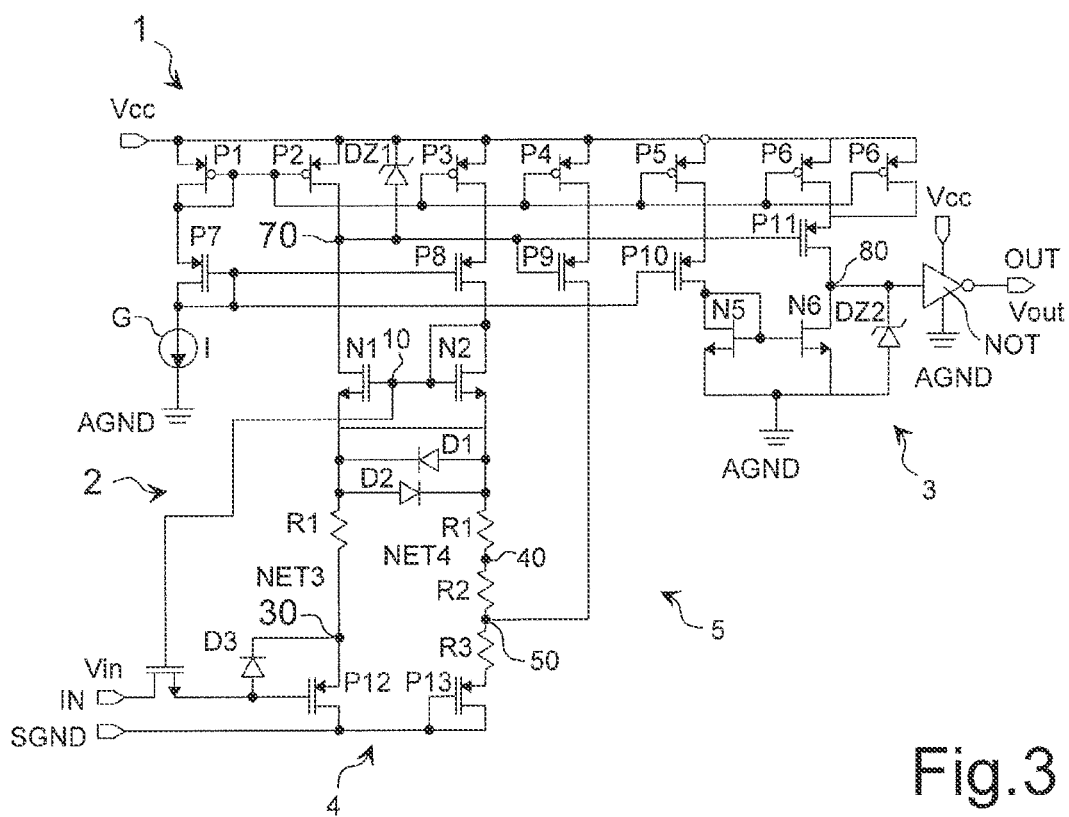
FIG. 3 is a circuital implementation of the diagram in FIG. 2.

In particular, the first N1 and the second N2 transistors are both supplied by a single bias current generator G: the first transistor N1 is supplied through a first current mirror formed by p-type MOSFET transistors P1, P2 and, similarly, a first cascode current mirror formed by p-type MOSFET transistors P1, P3, P7, P8 is adopted for supplying the drain terminal of the second transistor N2 (FIG. 3).

Preferably, to remove undesired ripple or fluctuations which introduce output noise, said voltage comparator 5 is a hysteresis voltage comparator comprising said first N1 and said second N2 n-type MOSFET transistors, said first and second resistors R1 respectively connected in series with the source terminals of the transistors N1, N2, and one or more resistors R2, R3 in series connected in series with the second resistor R1.

The hysteresis voltage comparator 5 (FIG. 2) also comprises a first switch P9, for example a p-type MOSFET transistor, the gate terminal of which is connected to the intermediate output terminal 70; thus the first switch P9 is driven by said intermediate signal NETT. Being supplied by a third bias current generator G3, the first switch P9 manages a further flow of bias current I through a third resistor R3 (R3 needs to have a value different from zero) of the resistors R2, R3 in series. Particularly, the p-type MOSFET P9 has its drain terminal connected to a node 50 between the resistors R2 and R3 of the series.

Particularly, the first switch P9 is supplied by the bias current generator G through a second current mirror formed by two p-type MOSFET transistors P1, P4 (FIG. 3).

A first D1 and a second D2 diodes are connected in opposite ways between the source terminals of the first and the second transistors N1, N2 to protect the gate terminals of transistors N1, N2 from voltage spikes which could be received at the input terminal IN of the high voltage comparison circuit 1.

A first Zener diode DZ1 is arranged between the supply voltage Vcc and said intermediate output terminal 70 to limit the intermediate signal NETT at the intermediate output terminal 70 of the hysteresis comparator 5 (FIG. 3).

Figure 2:
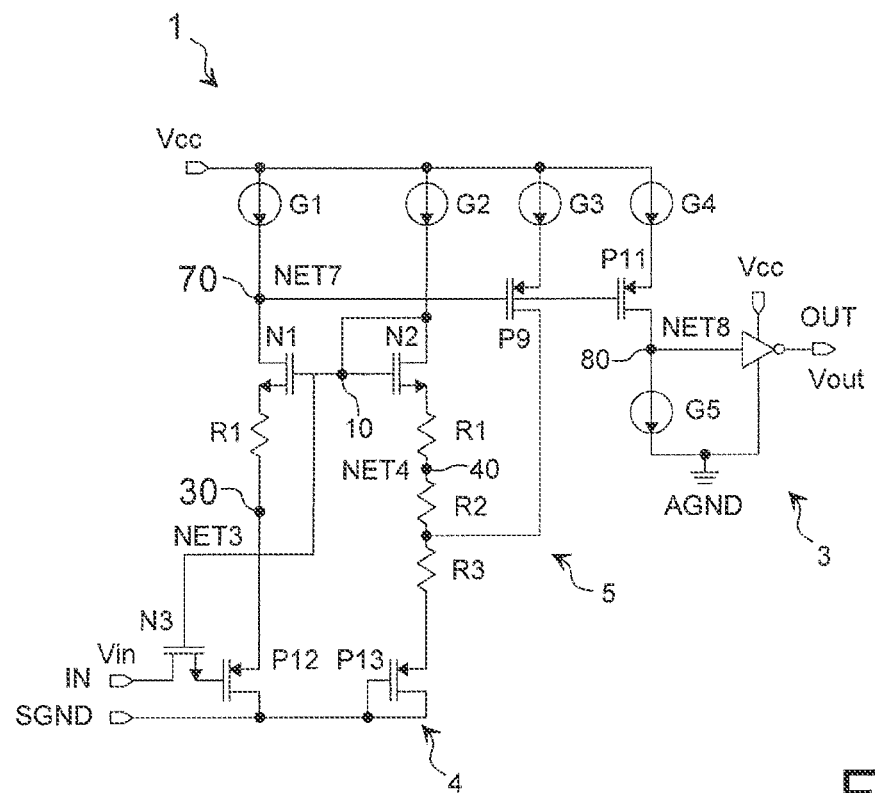
FIG. 2 is a diagram of the high voltage comparison circuit in FIG. 1.

The input stage 2 then comprises at least a voltage buffer 4 configured to receive the input voltage signal Vin and to provide it to the high voltage comparison circuit 1 (FIG. 2). More particularly, the input voltage signal Vin is received by means of the voltage buffer 4 through the first input terminal 30 of the hysteresis comparator 5.

The voltage buffer 4 comprises a first p-type MOSFET transistor P12 configured as a source-follower and arranged between the resistor R1 in series to the first transistor N1 and the first voltage reference SGND. The p-type MOSFET transistor P12 is driven through the gate terminal by the input voltage signal Vin.

Preferably, a second p-type MOSFET transistor P13 configured as a diode is arranged between the third resistor R3 in series with R1, R2 to the second transistor N2 and the first voltage reference SGND.

The first p-type MOSFET transistor P12 in source-follower configuration acts for decoupling the input terminal IN from the input terminal 30 of the hysteresis comparator 5, this allows zero current absorption at the input terminal IN in case of input voltage Vin variation.

The hysteresis function of the comparator 5 is entrusted to a voltage reference given by the series resistors R2, R3 and the second p-type MOSFET transistor P13 by means of the injection of the bias current I to the node 50 through the second current mirror P1, P4.

Preferably, the input voltage signal Vin is provided to the input stage 2 by means of a pass-gate N3 arranged between the input terminal IN and the gate terminal of the first p-type MOSFET transistor P12. For example the pass-gate N3 is a n-type MOSFET transistor the gate terminal of which is connected to the common-gate node 10. The pass-gate N3, having its drain terminal connected with the input terminal IN, allows the input terminal IN to withstand high voltages and, at the same time, has a clamp function, protecting the gate terminal of the first p-type MOSFET transistor P12.

A diode D3 is connected between the gate and source terminals of the first p-type MOSFET transistor P12 to protect the same from voltage spikes which could cause an inversion of polarity between gate and source terminals.

On the other hand, the output stage 3 comprises a second switch P11, for example a p-type MOSFET transistor, the gate terminal of which is connected to the intermediate output terminal 70; thus even the second switch P11 is driven by said intermediate signal NETT. Being supplied by a fourth bias current generator G4, the second switch P11 allows the flow of a double bias current I towards an internal node 80. More particularly, the second switch P11 is supplied by the common bias current generator G through a third current mirror formed by transistors P1, P6 (FIG. 3).

A fifth current bias generator G5 (FIG. 2) is also connected between the internal node 80 and the second voltage reference AGND. In particular, a fourth current mirror formed by n-type MOSFET transistors N5, N6 the output of which is also connected with the internal node 80, mirrors to said internal node 80 the bias current I provided in turn by means of a second cascode current mirror formed by p-type MOSFET transistors P1, P5, P7, P10 (FIG. 3). A voltage signal NET8, in response to the intermediate signal NETT, is provided at the internal node 80.

Finally, the output stage 3 comprises an inverter NOT with its input connected to the internal node 80, said inverter NOT being configured for providing at its output a negated value of the voltage signal NET8; the output of the inverter NOT coincides with the output terminal OUT of the high voltage comparison circuit 1.

A second Zener diode DZ2 is arranged between the internal node 80 and the second voltage reference AGND to limit the voltage drop across the n-type MOSFET transistor N6 of the fourth current mirror N5, N6 (FIG. 3).

It is assumed for example that the first voltage reference SGND can fluctuate of +/−5V with respect to the second voltage reference AGND (that is supposed to be equal to 0V). Furthermore, to give a numerical example, is assumed that:

I=25 μA
R1=2KΩ
R2=32KΩ
R3=16KΩ
Vz=3.3V where Vz is the voltage drop across the Zener diodes DZ1, DZ2.

In this case, in order to allow the correct operation of the input stage 2, even when the common mode potential of the first voltage reference SGND moves of +5V with respect to the second voltage reference AGND, a supply voltage Vcc greater of a couple of Volts is required (in this case equal to 10V).

In operation (FIG. 3), when the input voltage signal Vin is equal to the first voltage reference SGND, even the gate terminal of the first p-type MOSFET transistor P12 has a voltage equal to the first voltage reference SGND.

The first input terminal 30 of the hysteresis comparator 5 has a greater voltage value than the second input terminal 40. The voltage drop between the two input terminals 30, 40 in closed loop is between the gate-source terminals of the first transistor N1. This cause an increasing of the current pulled from the n-type MOSFET transistor N1 that causes an unbalance of the intermediate output terminal 70; the voltage NETT becomes (FIG. 5):

$$NET7=Vcc-Vz=6.7V$$

The first switch P9 is closed, a further bias current I flows through the third resistor R3. The second voltage signal NET4 at the second input terminal 40 will be equal to:

$$NET4=Vgs13+I*R2+2I*R3=V+_{Hysteresis}$$

where $V+_{Hysteresis}$ is one of the two voltage thresholds of the hysteresis comparator 5.

When the input voltage signal Vin increases with respect to the first voltage reference SGND, even the first voltage signal NET3 at the second input terminal 30 of the hysteresis comparator 5 increases. At this point, when said first voltage signal NET3 is greater than the second voltage signal NET4 ($V+_{Hysteresis}$) the gate-source voltage Vgs1 of the first transistor N1 (and even its current) decreases. Simultaneously, the drain terminal of the p-type MOSFET transistor P2 pulls the intermediate output terminal 70 to voltage Vcc.

$$NET7=Vcc=10V$$

The first switch P9 is opened, no further current flows through it and the third resistor R3 is crossed by the only bias current I provided by the first cascode current mirror P1, P3, P7, P8.

The second voltage signal NET4 at the second input terminal 40 will be equal to:

$$NET4=Vsg13+I*(R2+R3)=V-_{Hysteresis}$$

that is the second voltage threshold of the hysteresis comparator 5.

At this point, to switch the logic level, the voltage signal NET3 at the first input terminal 30 (equal to Vin+Vsg13) must be lowered under the voltage value of $V-_{Hysteresis}$.

Figure 4:
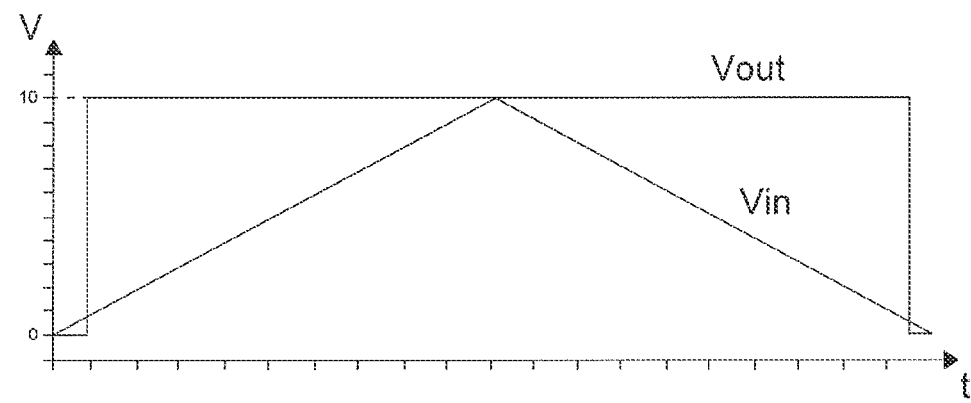
FIGS. 4-8 are time diagrams showing the signals in play in the high voltage comparison circuit.

The hysteresis range of the comparator 5 is given by (FIG. 4):

$$V_{Hysteresis}=V+_{Hysteresis}-V-_{Hysteresis}$$

where $V_{Hysteresis}$=NET4−NET3=I*R3=400 mV, which is the voltage drop across the third resistor R3.

On the other hand, at the output stage 3, the intermediate signal NET7 drives at the same time the second switch P11, activating a game of current mirrors (the third current mirror P1, P6 and the fourth current mirror N5, N6) both referred to the second voltage reference AGND.

In particular, when NET7=Vcc−Vz the second switch P11 is closed, so that the internal node 80 is connected to the supply voltage Vcc and therefore the voltage at output terminal OUT, which is the output of the inverter NOT, is:

$$Vout=AGND=0V$$

Otherwise, when NET7=Vcc the second switch P11 is opened and the internal node 80 is connected to the second ground reference AGND. The output voltage signal Vout in this case is:

$$Vout=Vcc=10V$$

Figure 5:
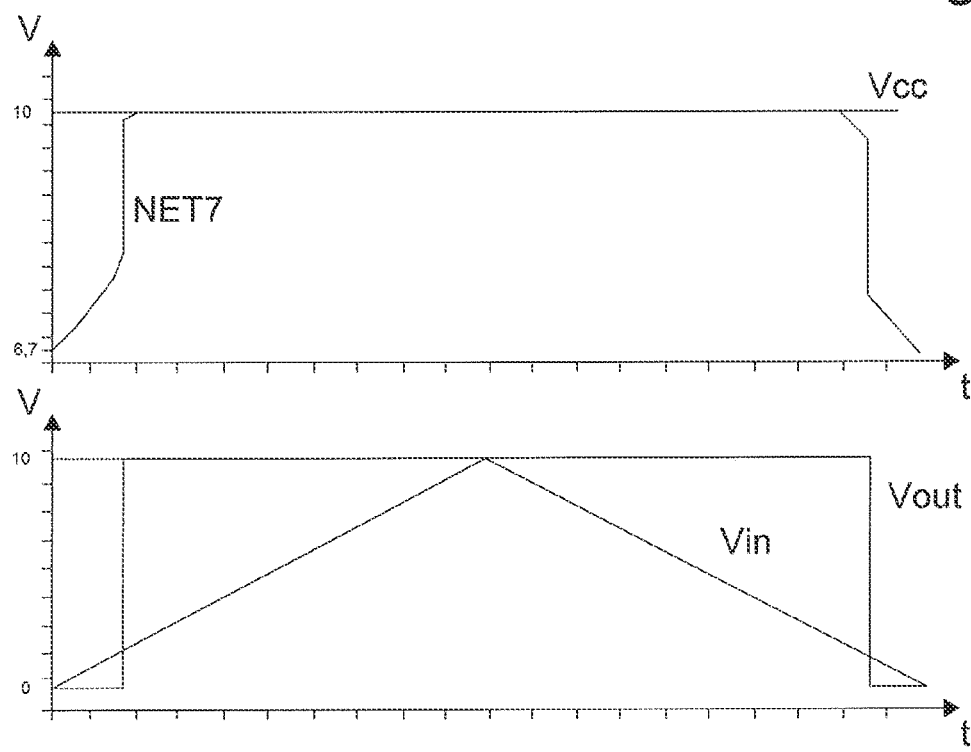
Figure 6:
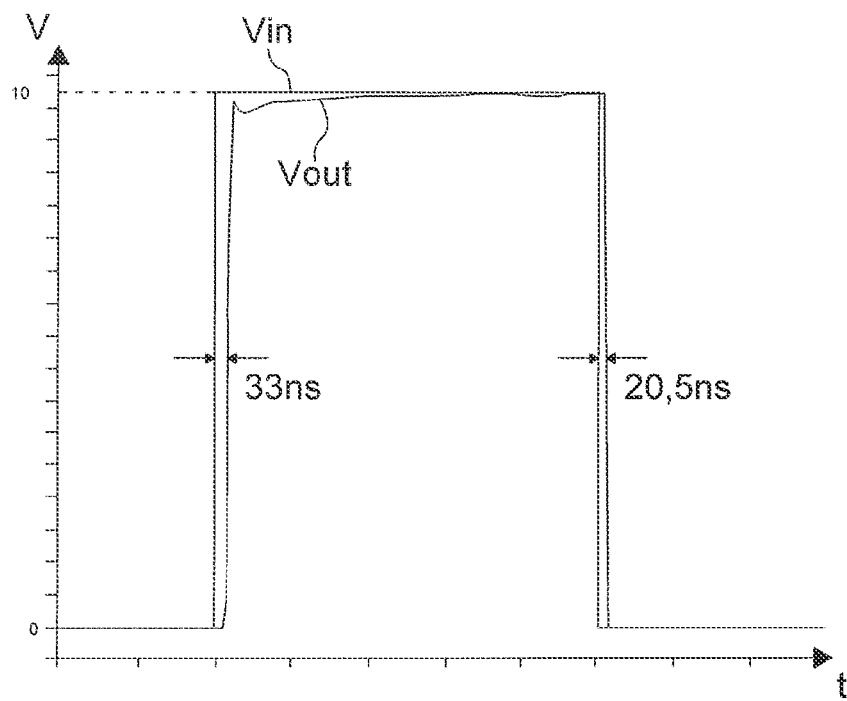

As is shown in FIG. 5, while at the intermediate output terminal 70 the intermediate signal NET7 switches between the Vcc and Vcc-Vz logic values (10V, 6.7V), the output voltage signal Vout will switch between the Vcc and AGND logic values (10V, 0V). The output voltage signal Vout will be a voltage replica of the input voltage signal Vin with a delay of about 20÷30 ns (FIG. 6).

Figure 7:
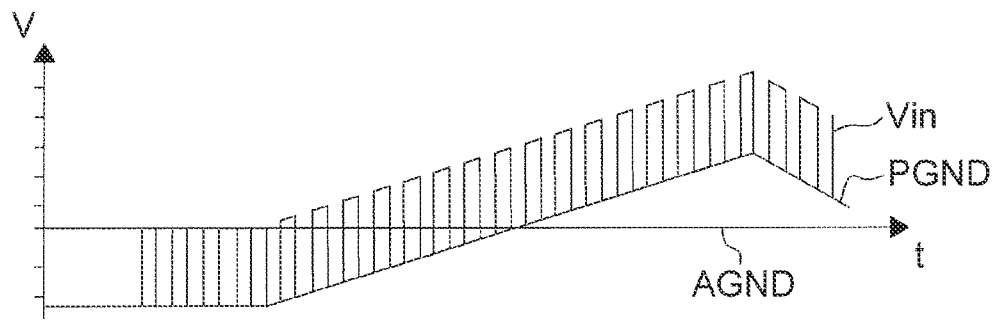
Figure 7:
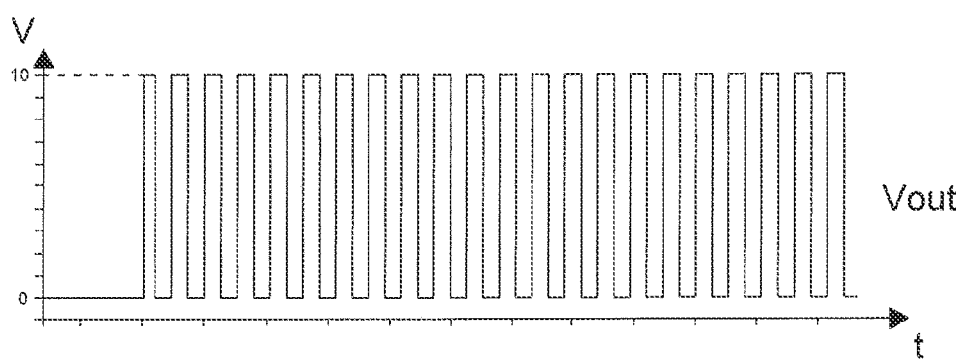

Thus, even if the first voltage reference SGND fluctuates with respect to the second voltage reference AGND (FIG. 7), the output voltage signal Vout will be not affected of these voltage variations, switching always between the Vcc and AGND logic values.

Figure 8:
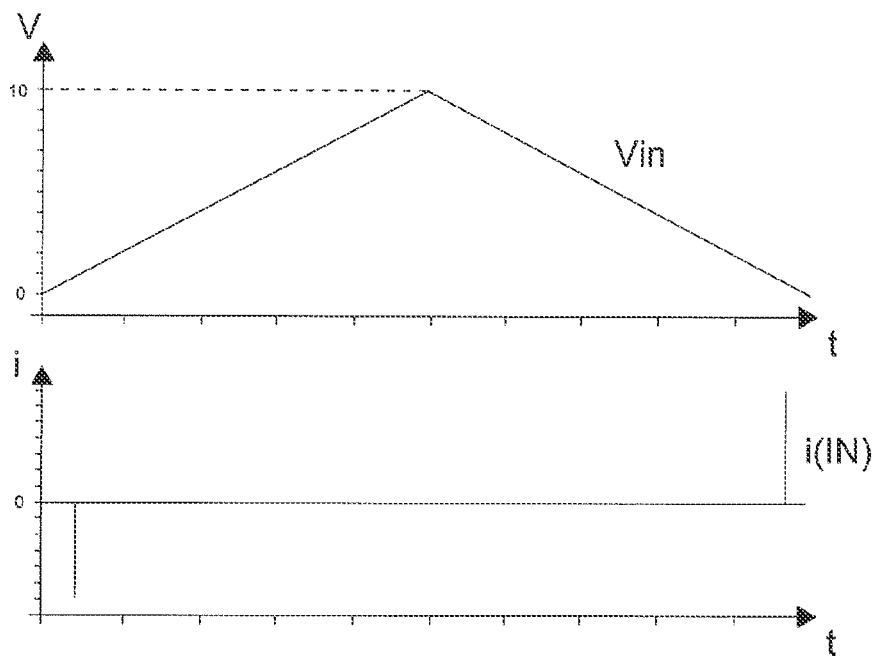

Moreover, as the FIG. 8 shows, the high voltage comparison circuit 1 has a zero current consumption (indicated with i(IN)) at the input terminals.

The invention claimed is:

1. A high voltage comparison circuit, comprising:
   an input stage arranged between a supply voltage node and a first voltage reference node, said input stage configured to receive an input voltage signal and comprising a voltage comparator configured to provide an intermediate signal at an output terminal of the input stage as a result of a comparison between the input voltage signal and a first voltage at said first voltage reference node; and
   an output stage arranged between said supply voltage node and a second voltage reference node configured to receive a second voltage different from said first voltage, said output stage configured to receive said intermediate signal and to provide an output voltage signal which is in response to said intermediate signal,
   wherein said voltage comparator comprises:
      a first-type MOSFET transistor and a second n-type MOSFET transistor having their gate terminals connected together to a common-gate node, said second n-type MOSFET transistor being configured as a diode, and
      a first resistor and a second resistor each connected in series with a source terminal of the first and second n-type MOSFET transistors, respectively, and
   wherein said input stage comprises:
      a voltage buffer through which the input voltage signal is received, and
      a pass-gate configured to receive the input voltage signal before the input signal is received by said voltage buffer, wherein said pass-gate comprises an n-type MOSFET transistor having a gate terminal connected to the common-gate node.

2. The high voltage comparison circuit according to claim 1, wherein said voltage comparator is a hysteresis voltage comparator.

3. The high voltage comparison circuit according to claim 2, wherein said hysteresis voltage comparator has a hysteresis range given by a voltage drop across a resistor.

4. A high voltage comparison circuit, comprising:
   an input stage arranged between a supply voltage node and a first voltage reference node, said input stage configured to receive an input voltage signal and comprising a voltage comparator configured to provide an intermediate signal at an output terminal of the input stage as a result of a comparison between the input voltage signal and a first voltage at said first voltage reference node; and
   an output stage arranged between said supply voltage node and a second voltage reference node configured to receive a second voltage different from said first voltage, said output stage configured to receive said intermediate signal and to provide an output voltage signal which is in response to said intermediate signal,
   wherein said input stage comprises a voltage buffer through which the input voltage signal is received,
   wherein said voltage comparator is a hysteresis voltage comparator,
   wherein said hysteresis voltage comparator further comprises:

a first n-type MOSFET transistor and a second n-type MOSFET transistor having their gate terminals connected together to a common-gate node, said second n-type MOSFET transistor being configured as a diode, a first resistor and a second resistor each connected in series with a source terminal of the first and second n-type MOSFET transistors, respectively, a third resistor coupled in series with said second resistor, and a first switch driven by said intermediate signal and configured to manage flow of a bias current toward said third resistor.

5. The high voltage comparison circuit according to claim 1, wherein said voltage buffer comprises:
a first p-type MOSFET transistor configured as a source-follower and arranged between the first resistor and the first voltage reference node, said first p-type MOSFET transistor having a gate terminal drive by the input voltage signal.

6. The high voltage comparison circuit according to claim 1, further comprising a first Zener diode coupled between the supply voltage node and the output terminal of the input stage.

7. A high voltage comparison circuit, comprising:
an input stage arranged between a supply voltage node and a first voltage reference node, said input stage configured to receive an input voltage signal and comprising a voltage comparator configured to provide an intermediate signal at an output terminal of the input stage as a result of a comparison between the input voltage signal and a first voltage at said first voltage reference node; and an output stage arranged between said supply voltage node and a second voltage reference node configured to receive a second voltage different from said first voltage, said output stage configured to receive said intermediate signal and to provide an output voltage signal which is in response to said intermediate signal, wherein said input stage comprises a voltage buffer through which the input voltage signal is received, wherein said voltage comparator comprises:
a first-type MOSFET transistor and a second n-type MOSFET transistor having their gate terminals connected together to a common-gate node, said second n-type MOSFET transistor being configured as a diode, a first resistor and a second resistor each connected in series with a source terminal of the first and second n-type MOSFET transistors, respectively, and a first diode and a second diode oppositely connected between source terminals of the first and second n-type MOSFET transistors.

8. A circuit, comprising:
a supply voltage node configured to receive a supply voltage;
a first reference voltage node configured to receive a first reference voltage;
a second reference voltage node configured to receive a second reference voltage;
a first MOS transistor of a first conductivity type configured to receive an input signal and having a drain terminal coupled to the first reference voltage node;

a second MOS transistor of the first conductivity type having gate and drain terminals coupled to the first reference voltage node;

a third MOS transistor of a second conductivity type having a drain terminal, a source terminal and a gate terminal;

a first resistor network coupled between the source terminal of the third MOS transistor and a source terminal of the first MOS transistor;

a fourth MOS transistor of the second conductivity type having a drain terminal, a source terminal and a gate terminal, wherein the gate terminal of the fourth MOS transistor is coupled to the gate terminal of the third MOS transistor;

a second resistor network coupled between the source terminal of the fourth MOS transistor and a source terminal of the second MOS transistor;

a fifth MOS transistor of the second conductivity type having a gate terminal coupled to the drain terminal of the third MOS transistor and having a drain terminal coupled to an intermediate node in the second resistor network; and a sixth MOS transistor of the second conductivity type have a gate terminal coupled to the drain terminal of the third MOS transistor and having a source terminal coupled to the supply voltage node and a drain terminal coupled to the second reference voltage node.

9. The circuit of claim 8, further comprising a pass gate transistor coupled between an input node configured to receive the input signal and a gate terminal of the first MOS transistor, wherein a control terminal of the pass gate transistor is coupled to the gate terminals of the third and fourth MOS transistors.

10. The circuit of claim 8, further comprising a zener diode coupled between the drain terminal of the third MOS transistor and the supply voltage node.

11. The circuit of claim 8, wherein the gate terminal of the fourth transistor is coupled to the drain terminal of the fourth transistor.

12. The circuit of claim 8, further comprising a logic-NOT gate having an input coupled to the drain terminal of the sixth MOS transistor.

13. The circuit of claim 8, further comprising a bias circuit configured to supply bias currents to the drain terminals of the third and fourth MOS transistors and supply bias currents to the source terminals of the fifth and sixth MOS transistors.

14. The circuit of claim 8, further comprising a zener diode coupled between the drain terminal of the sixth MOS transistor and the second reference voltage node.

15. The circuit of claim 8, further comprising:
a first bias circuit configured to source bias current to the source terminal of the sixth MOS transistor; and
a second bias circuit configured to sink bias current from the drain terminal of the sixth MOS transistor.

16. The circuit of claim 8, wherein the second resistor network comprises:
a first resistor; and
a second resistor coupled in series with the first resistor at the intermediate node.

17. The circuit of claim 16, wherein second resistor comprises: a third and fourth resistors coupled in series, and wherein the first resistor network comprises a fifth resistor having a resistance equal to a resistance of the third resistor.

* * * * *

UNITED STATES PATENT AND TRADEMARK OFFICE
CERTIFICATE OF CORRECTION

PATENT NO. : 9,356,587 B2
APPLICATION NO. : 14/622322
DATED : May 31, 2016
INVENTOR(S) : Ignazio Bruno Mirabella et al.

Page 1 of 1

It is certified that error appears in the above-identified patent and that said Letters Patent is hereby corrected as shown below:

In the Specification:

At column 3, line number 20, please replace the term [NETT] with -- NET7 --.

At column 3, line number 38, please replace the term [NETT] with -- NET7 --.

At column 4, line number 17, please replace the term [NETT] with -- NET7 --.

At column 4, line number 31, please replace the term [NETT] with -- NET7 --.

At column 5, line number 4, please replace the term [NETT] with -- NET7 --.

Signed and Sealed this
Twenty-third Day of August, 2016

Michelle K. Lee
*Director of the United States Patent and Trademark Office*